United States Patent [19]

Ogita

[11] 4,249,261
[45] Feb. 3, 1981

[54] SUPERHETERODYNE RADIO RECEIVER WITH NEARBY-STATION INTERFERENCE DETECTION

[75] Inventor: Minoru Ogita, Hamamatsu, Japan

[73] Assignee: Nippon Gakki Seizo Kabushiki Kaisha, Hamamatsu, Japan

[21] Appl. No.: 87,071

[22] Filed: Oct. 22, 1979

[30] Foreign Application Priority Data

Oct. 28, 1978 [JP] Japan .................................. 53-133078

[51] Int. Cl.³ ...................... H04B 1/12; H04B 15/00; H04B 17/00; H04B 1/26
[52] U.S. Cl. ................................... 455/305; 455/206; 455/266; 455/311
[58] Field of Search .................. 455/63, 206, 219, 220, 455/222–225, 296, 303, 305, 306, 311, 218, 295, 304, 266

[56] References Cited

U.S. PATENT DOCUMENTS

| 3,366,884 | 1/1968 | Kurusu | 455/224 |
| 3,432,765 | 3/1969 | Gottfried | 455/305 |
| 3,621,401 | 11/1971 | Young, Jr. | 455/305 |
| 3,995,220 | 11/1976 | Hansen | 455/225 |
| 4,126,828 | 11/1978 | Kumagai | 455/303 |

Primary Examiner—Marc E. Bookbinder
Attorney, Agent, or Firm—Cushman, Darby & Cushman

[57] ABSTRACT

In a superheterodyne radio receiver, by observing the RF and IF signal levels is detected an occurrence of an interference caused by an interfering strong signal of an adjacent station at a frequency close to that of a desired station signal to be received by the receiver. In case such interference is detected, a cancelling signal is fed to the RF amplifier stage to cancel out this interfering station signal, or the selectivity of the RF amplifier stage is set to be sharper in order to reject the interfering station signal.

11 Claims, 6 Drawing Figures

SUPERHETERODYNE RADIO RECEIVER WITH NEARBY-STATION INTERFERENCE DETECTION

BACKGROUND OF THE INVENTION (a) Field of the Invention

The present invention is related generally to a superheterodyne radio receiver, and more particularly, it pertains to an improvement of a superheterodyne radio receiver for detecting and preventing the occurrence of an interference by an interfering station signal at a frequency close to that of a desired station signal to be received by the receiver.

(b) Description of the Prior Art

In case the receiving antenna of a radio receiver catches, in addition to a desired station signal to be received by the receiver, interfering another stronger station signal, i.e. adjacent-channel station signal, at a frequency close to that of the desired station signal, the receiver finds it difficult to receive the desired station signal in a good condition. As the counter-measures which have been taken in the past to cope with the occurrence of an interference by such adjacent-channel station signal, the following means are provided in radio receivers. They include: (a) the pass-band width of band-pass filters in either the RF or IF amplifier stage is arranged narrow; (b) provision of a wider dynamic range of the RF amplifier stage, the mixer stage and the IF amplifier stage; and (c) application of automatic gain control techniques. However, in each of these efforts in the prior art, there indeed has been a limit in the ability of excluding such interference by an adjacent-channel station signal, owing to the restrictions encountered in the arrangement of circuitry of the radio receiver.

SUMMARY OF THE INVENTION

It is, therefore, a principal object of the present invention to provide a circuit arrangement for detecting the occurrence of an interference by an adjacent-channel station signal in a superheterodyne radio receiver.

Another object of the present invention is to provide means for excluding such occurrence of interference by the adjacent-channel station signal in a superheterodyne radio receiver.

Still another object of the present invention is to provide a superheterodyne radio receiver which is practically free of interference by an adjacent-channel station signal.

According to the present invention, arrangement is provided so that, in case the level of the signal derived from the high-frequency amplifying stage of the radio receiver is higher than a predetermined level and in case the level of the signal derived from the intermediate-frequency amplifying stage of the receiver is lower than a predetermined level, there is generated a control signal to exclude the interference by an adjacent electric wave by utilizing said control signal.

These and other objects, as well as the features and the advantages of the present invention will become apparent from the following detailed description of the preferred embodiments of the present invention when taken in conjunction with the accompanying drawings.

BRIEF DESCRIPTION OF THE DRAWINGS

Throughout the drawings, like parts are designated by like reference numerals or symbols.

DETAILED DESCRIPTION OF THE PREFERRED EMBODIMENTS

Prior to explaining the preferred embodiments of the present invention, brief description will be made about the adjacent-channel interference and the concept of the detection of the occurrence of the adjacent-channel interference in a superheterodyne radio receiver according to the present invention.

Figure 1:
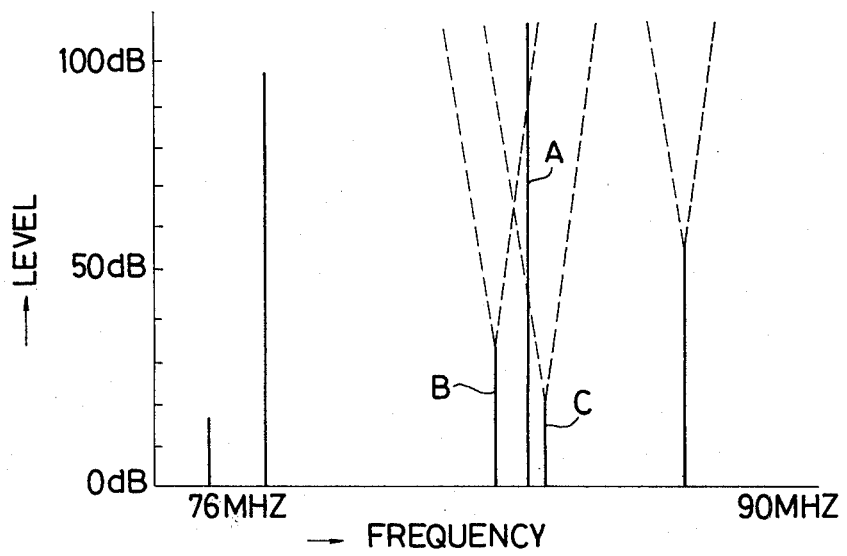
FIG. 1 is a chart for explaining the principle of the present invention, and shows the manner of interference caused by adjacent-channel station signals and of its detection according to the present invention, in which frequency spectrums of station signals within the receiving area of a radio receiver are shown by solid lines, and in which the selectivity curves of the receiver when it is tuned to the station signals are shown by dashed lines.

In FIG. 1 are shown frequency spectrums of station signals within the receiving area of a radio receiver. In FIG. 1, vertical solid lines A, B and C represent frequency spectrums of those signals of stations receivable by a radio receiver. The diverging broken lines at the upper parts of the spectrums of the frequencies B and C represent selectability curves of the receiver for these frequencies. In case the radio receiver is tuned to a station signal A which has a signal level much greater than the levels of the adjacent broadcasting stations B and C, the radio receiver is able to receive this desired station signal A in normal good condition without being affected by adjacent-channel signals, even if these station signals B and C have frequencies considerably close to that of the station signal A. This is because of the fact that, as stated above, the station signal A has a level sufficiently higher than the levels of the signals B and C of the adjacently located stations. In case, however, either the station signals B or C both of which are shown in solid lines is to be received by the receiver, an interference of the desired channel signal may be caused in the receiver by the strong channel signal of the adjacently located station A. Namely, the presence of the strong adjacent-channel signal A will cause in the receiver an adverse phenomenon such as an interference at the IF (intermediate-frequency) amplifier stage or a saturation of the RF (radio-frequency) amplifier stage and will bring about a degradation of the sensitivity or jamming of the receiver. Hence, the receiver is subjected to such various interferences by the adjacent-channel signal and is unable to receive the desired station signal B or C in good condition.

Here, let us take up a superheterodyne radio receiver to explain the present invention. In the state that such interference as mentioned above is being caused in the receiver by the presence of an adjacent-channel signal which is stronger in level than a desired station signal, the signal level at the RF amplifier stage is relatively high. However, in such state, the signal level at the IF amplifier stage, which is related to the desired station signal, is relatively low. In short, whenever an interference is caused in a superheterodyne radio receiver by an adjacent-channel signal, it can be considered that the signal level in the RF amplifier stage exceeds a certain RF level and that the IF amplifier stage has an IF signal level lower than a certain IF level.

Therefore, in a superheterodyne radio receiver embodying the present invention, there is provided an interference-detecting means which is arranged to be operative so that, for both signal levels in the RF amplifier stage and in the IF amplifier stage, whenever there is detected the condition that the RF signal level exceeds a predetermined reference level and that at the same time the IF signal level is lower than another predetermined reference level, this detection means delivers a detection signal which represents an indication of the occurrence, in the receiver, of an interference by an adjacent-channel signal. In one aspect of the present invention, when such a detection signal is generated as a control signal, a cancelling signal related to the strongest one of station signals received is generated by a circuit means and is supplied to the RF amplfier stage, whereby the strongest station signal, i.e. the signal from the adjacently located station causing the interference, is cancelled out in the RF amplifier stage, and only the desired station signal is fed to the subsequent mixer stage. According to another aspect of the present invention, the selectivity of the RF amplifier stage is varied by a circuit means in response to said detection signal so as to avoid the interference by the adjacent-channel signal from occurring in the receiver. That is, when the detection signal is delivered, the selectivity is elevated to a much sharper degree as compared with the condition that no interference by an adjacent-channel signal is detected.

Detailed description will hereunder be made of the preferred embodiments of the present invention.

Figure 2:
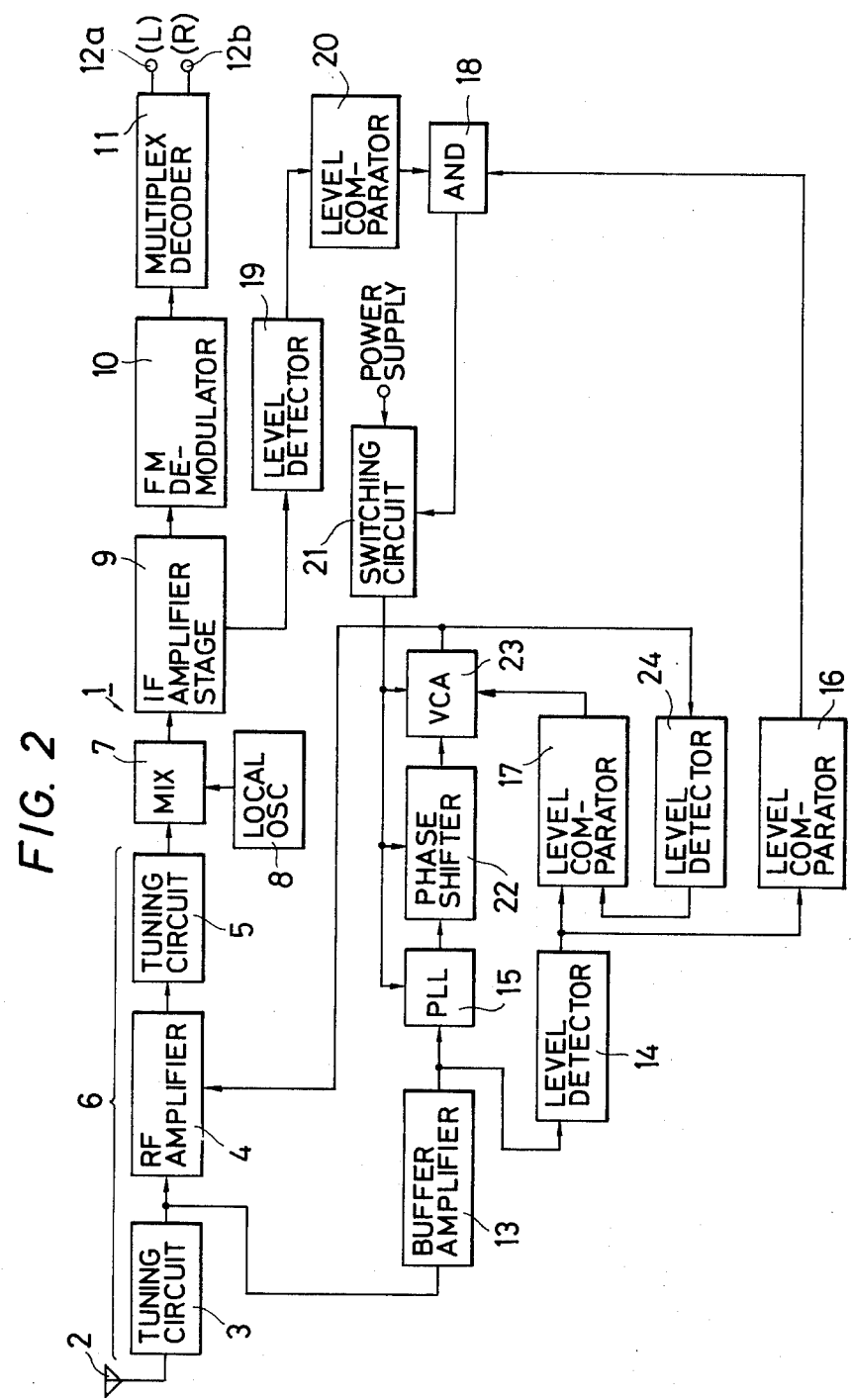
FIG. 2 is a block diagram showing an embodiment of a superheterodyne FM stereophonic radio receiver according to the present invention.

An embodiment of an FM stereophonic radio receiver according to the present invention is shown in block form in FIG. 2. This receiver includes a signal receiving and processing circuitry, i.e. signal system, for a superheterodyne system and a circuit arrangement to exclude the jamming electric waves of adjacent stations by utilizing said control signal. This signal system, generally indicated at 1, comprises an RF amplifier stage generally indicated at 6, a mixer stage 7, a local oscillator 8, an IF amplifier stage 9, an FM demodulator 10, and a multiplex decoder 11. The RF amplifier stage 6 comprises a first tuning circuit 3 coupled to a receiving antenna 2, and an RF amplifier 4 which is followed by a second tuning circuit 5. Usual operation is carried out in a manner as follows. FM broadcasting station signals within the receiving area of the receiver are picked up by the antenna 2 coupled to the RF amplifier stage 6. Among those station signals captured, a desired station signal is selected and amplified at the RF amplifier stage 6, and then fed to the mixer stage 7 which works with the local oscillator 8. That is, an unmodulated signal generated by the local oscillator 8 is mixed with the RF signal from the RF amplifier stage 6, and the resulting signal, i.e. an IF signal, is fed to the IF amplifier stage 9. Here, the IF signal is amplified, before being applied to the FM demodulator 10 in which it is subjected to FM demodulation. The multiplex decoder 11 restores, or separates, into the right- and left-channel audio signals from the output of the FM demodulator, and the resulting audio signals are delivered to the output terminals 12a (left channel) and 12b (right channel) where these two audio signals are derived.

The radio receiver according to the present invention further includes an interference-detecting circuitry for detecting the occurrence of an interference by an adjacent-channel signal caused by its stronger signal level at a frequency close to that of a desired station signal to which the receiver is tuned. This circuitry is comprised of two level detectors 14 and 19, two level comparators 16 and 20, and an AND logic circuit 18. The level detector 14 receives, through a buffer amplifier 13, the output of the first tuning circuit 3 of the RF amplifier stage 6, and provides a dc output voltage related to the level of the inputted RF signal. The level detector 14 as well as other level detectors including those described later may be similar to that kind of envelope detector which has been used as the detector stage in AM radio receivers. The output of this level detector 14 is received by the level comparator 16 which delivers a logical "1" level output voltage in case its input exceeds a predetermined reference voltage. This reference level corresponds to a signal level at the RF amplifier stage which represents the fact that the RF signal has enough strength to provide an IF signal of such strength as will provide a good receiving condition if the RF signal includes no interference signal, and said reference level is determined in conjunction with another reference level described later. The level detector 19 receives the IF signal from the IF amplifier stage 9, and generates a dc output voltage related to the level of the IF signal. The output of this level detector 19 is level-compared with another predetermined reference voltage by the level comparator 20. This reference level corresponds to a signal level at the IF amplifier stage which represents the fact that the IF signal has such poor strength as will be easily affected by an interference signal and which is somewhat higher than a critical lowest IF signal level required for ensuring a miniumum receiving condition. The comparator 20 supplies a logical "1" level output in case said dc output is lower in level than the reference voltage. The outputs of these two level comparators 16 and 20 are applied to the AND logic circuit 18. If both inputs assume the logical "1" level at the same time, the AND logic circuit 18 provides an output voltage of "1" level which represents the detection of the occurrence of an interference by a strong interfering signal of an adjacent station.

The receiver includes still another circuitry which, in response to the afore-mentioned interference-detecting circuitry, functions to reject such interference by an adjacent-channel signal. This rejection circuitry comprises a phase-locked loop 15, a phase shifter 22, a voltage-controlled amplifier 23, a switching circuit 21, a level detector 24, and a level comparator 17. The phase-locked loop 15 is arranged to be synchronized with the strongest signal component of the output of the tuning circuit 3 which is supplied thereto via the buffer amplifier 13. Therefore, in case an interference is caused by an interfering strong signal of an adjacent station, the phase-locked loop 15 gererates a signal which is synchronous with this interfering strong station signal. The output signal of the phase-locked loop 15 is phase-shifted by the phase shifter 22 to compensate for the phase difference between the input and the output of the phase-locked loop 15. In this embodiment, such phase difference is about 90°. The output signal of this phase shifter 22 is fed to the voltage-controlled amplifier 23 as its signal input. Thus, the voltage-controlled amplifier (VCA) 23 provides an output signal at the same frequency as that of the strongest signal component (the interfering station signal in case an interference by a strong signal of an adjacent station occurs) among the output of the tuning circuit 3. In this embodiment, the voltage-controlled amplifier 23 is an inverting amplifier, so that the input and the output thereof are 180° out of phase. The level detector 24 generates a dc output voltage related to the level of the output signal of the voltage-controlled amplifier 23, and this dc output voltage is inputted to the level comparator 17 to which is also inputted the dc output voltage of the level detector 14. The level comparator 17 delivers a dc output voltage related to the level difference between these two inputs thereof. The output voltage of the level comparator 17 is supplied to the voltage-controlled amplifier 23 as a gain-control voltage. In accordance with this gain-control voltage, the gain of this amplifier 23 is determined. Thus, the input signal to the VCA 23 is subjected to amplitude-modulation in accordance with the gain-control voltage applied thereto. Since the gain-control voltage is varied in accordance with the output level of the level detector 14, the output signal of the voltage-controlled amplifier 23 is given an envelope characteristic corresponding to that of the strongest RF signal component of the output of the tuning circuit 3. As such, in case an interference is caused by a stronger interfering station signal, there is derived, at the output of the amplifier 23, a cancelling signal which is used for cancelling out the interfering strong station signal.

An operating power voltage for the circuits 15, 22 and 23 is supplied via the switching circuit 21 which is actuated by the "1" level output of the AND logic circuit 18. In case an interference by an adjacent-channel signal takes place in the receiver, the AND logic circuit 18 drives its output voltage to the logical "1" level, tuning-on the switching circuit 21, so that the operating power voltage is applied to the circuits 15, 22 and 23. Then, the system including the circuits 15, 14, 17, 22 and 23 is enabled to generate the above-mentioned cancelling signal. This cancelling signal is fed to the RF amplifier 4 of the RF amplifier stage 6, in which the cancelling signal is amplified together with RF signals from the tuning circuit 3. Because of the opposing phase relationship between the cancelling signal and the corresponding RF signal component, i.e. interfering strong station signal, the latter interfering signal is substantially cancelled out or rejected. Thus, only a desired station signal is passed through the second tuning circuit 5 to be supplied to the mixer stage 7. Hence, the receiver is ensured to receive the desired station signal at a good reception condition and without being affected by adjacent-channel signals.

A concrete circuit arrangement of the essential part of the above-stated embodiment shown in FIG. 2 will hereunder be explained with reference to FIG. 3. In the Figure, the first tuning circuit 3 in the RF amplifier stage 6 is comprised of a parallel circuit formed by an antenna input coil (tuning coil) 100 and a variable capacitor 101. An antenna cable is coupled to the input coil 100 at a tap, and at another tap of this input coil 100 is coupled to a gate electrode of a field effect transistor 102 which constitutes the buffer amplifier 13. The transistor 102 is arranged as a source follower circuit, and its output signal is delivered at the source electrode to the level detector 14 and also to the phase-locked loop 15.

This phase-locked loop 15 is comprised of a voltage-controlled oscillator 31, a phase detector 32 and low-pass filter 33. This voltage-controlled oscillator 31 is a version of Clapp circuit and is comprised of a bipolar transistor 103, and an inductor coil 104, capacitors 105, 106, 107, 108 and 109, resistors 110 and 111, and varactor diode 112. The emitter and the collector electrodes of the transistor 103 are grounded via the capacitors 108 and 109, respectively. Its base electrode is coupled also to the emitter via the capacitor 107. The parallel connection of the coil 104 and capacitor 105 is connected between said base electrode and the circuit ground. Also, the base electrode of the transistor 103 is shunted through the resistor 111 and varactor diode 112 in parallel, and is coupled further to the output of the low-pass filter 33 via the resistor 110. The oscillator 31 oscillates at a frequency which is dependent upon the capacitance of the varactor diode 112, and this capacitance, in turn, is controllable by the voltage applied across this diode 112. Hence, the oscillating frequency of the voltage-controlled oscillator 31 is varied in accordance with the level of the dc output voltage of the low-pass filter 33.

In operation, the phase detector 32 compares the frequency of the voltage-controlled oscillator 31 with that of the strongest RF signal component of the output of the tuning circuit 3. This output is supplied, through the buffer amplifier 13, to the phase detector 32. The output of this phase detector 32 is passed through the low-pass filter 33, and is fed back to the voltage-controlled oscillator 31 to keep it exactly synchronous with the input signal of the phase detector 32.

An output signal of the phase-locked loop 15, which appears at Point 15a, is applied through a capacitor 114 to the gate electrode of a field effect transistor 115 which is provided in the voltage-controlled amplifier circuit 23. A series connection of an inductor coil 116 and a capacitor 117, which forms the phase-shifter 22, is connected in parallel to the gate electrode of the transistor 115. A dc output voltage of the level-comparator 17 is applied via a resistor 118 to the gate electrode of the transistor 115. The transistor 115 is in the source-grounded configuration, and its operating power voltage is supplied via a drain-load resistor 119 and via a bipolar transistor 113 which constitutes the switching circuit 21. A decoupling capacitor 120 is connected, in parallel, to the power supply line of the field effect transistor 115. The operating power voltage for the bipolar transistor 103 is also supplied through the bipolar transistor 113. The gain of the voltage-controlled amplifier circuit 23 is varied with the gate bias voltage applied to the field effect transistor 115, i.e. the dc output voltage of the level comparator 17.

Figure 3:
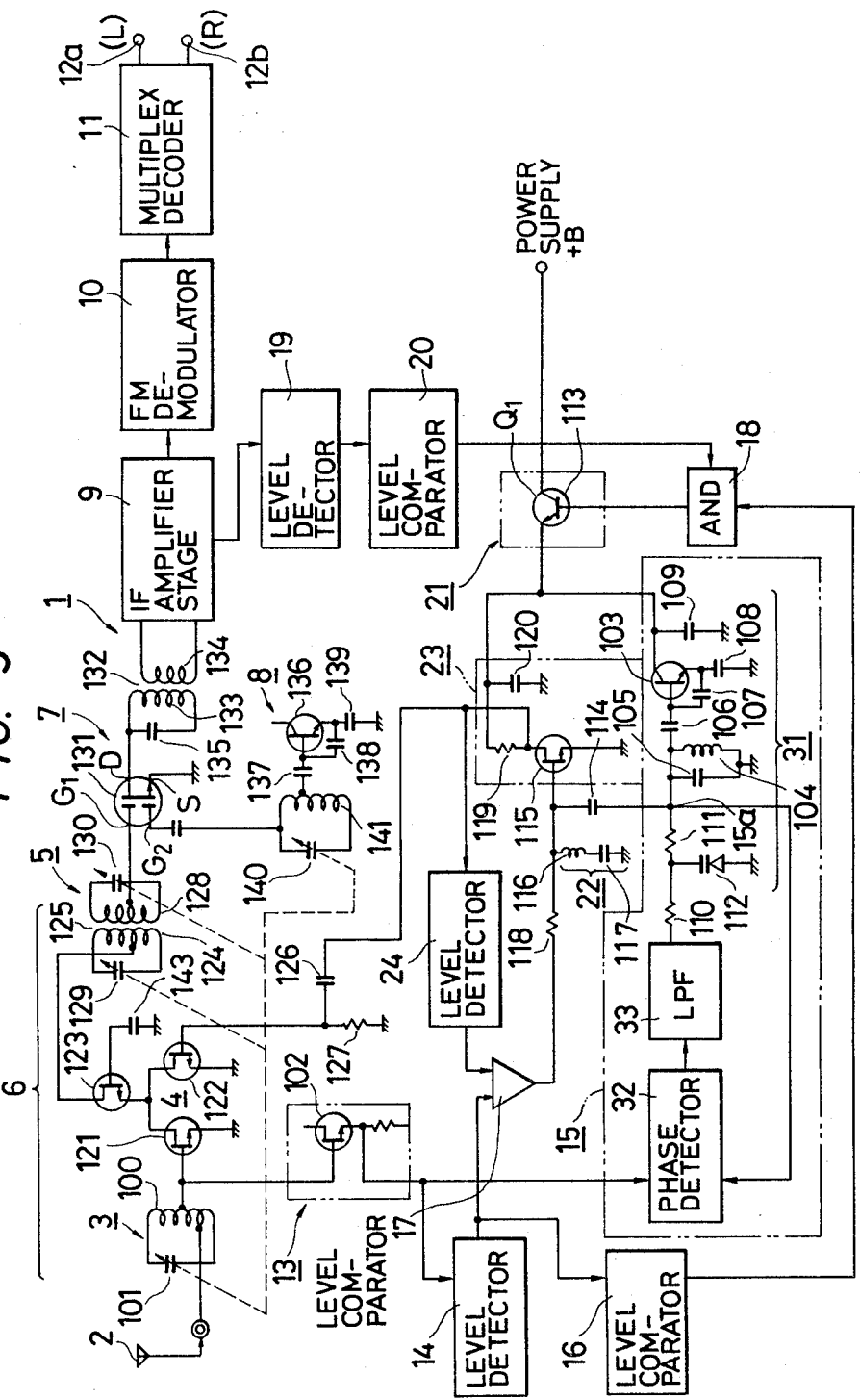
FIG. 3 is a circuit diagram of essential part of the embodiment shown in FIG. 2.

It should be noted that in FIG. 3, the dc circuitry for the transistors 102, 103, 113 and 115 is partially omitted for the purpose of simplicity of explanation.

The RF amplifier 4 in the RF amplifier stage 6 is comprised of field effect transistors 121, 122 and 123. Of these, the transistors 121 and 122 have the source electrodes grounded, and the drain electrodes coupled together and are further connected, via the transistor 123, to a tap of the primary winding 124 of a transformer 125. The gate electrode of the transistor 123 is grounded through a capacitor 143. The gate electrode of the transistor 121 is coupled to the input coil 100 in the circuit 3. To the gate electrode of the transistor 122 is applied the output signal of the voltage-controlled amplifier 23 via a network of a capacitor 126 and a resistor 127. Thus, RF signals from the tuning circuit 3 and the cancelling signal from the voltage-controlled amplifier 23 are added up together and amplified in the RF amplifier 4. As has been explained, in case an interference is caused by a interfering strong signal of an adjacent station, the cancelling signal substantially equals to the interfering station signal, but it is opposite in phase. Therefore, almost only a desired station signal is obtained across the primary winding 124 and a secondary winding 128 of the transformer 125. The transformer 125 forms, jointly with variable capacitors 129 and 130 which are provided in parallel with the windings, the second tuning circuit 5 of the RF amplifier stage 6. Those variable capacitors 129 and 130 are ganged to the variable capacitor 101 in the first tuning circuit 3. The mixer stage 5, on the other hand, is comprised of a MOS-type field effect transistor 131 with dual gate structure. An output of the tuning circuit 5 is fed to the first gate electrode $G_1$ of the transistor 131, and an output of the local oscillator 8 is applied to the second gate electrode $G_2$ of this transistor 131. The source electrode S of the transistor 131 is grounded. The transistor 131 is followed by a transformer 132 which has a primary winding 133 coupled to the drain electrode D of the transistor 131, and a secondary winding 134 coupled to the subsequent IF amplifier stage 9. The parallel circuit formed by the primary winding 133 and a capacitor 135 forms a tuning circuit. The local oscillator 8 is constructed as a version of Clapp circuit by a bipolar transistor 136, capacitors 137, 138 and 139, a variable capacitor 140, and an inductor coil 141. The transistor 136 has its base electrode coupled to a tap of the coil 141 via the capacitor 137 and also to its emitter electrode via the capacitor 138. This emitter electrode of the transistor 136 is grounded via the capacitor 139. The variable capacitor 140 which is provided in parallel with the coil 141 is ganged to the afore-mentioned variable capacitors 101, 129 and 130. It should be noted that, in FIG. 3, the dc circuitry for the transistors 121, 122, 131 and 136 is partly omitted for the simplicity of explanation.

The RF amplifier 4 in the RF amplifier stage 6 may be configured in the form of a differential amplifier. In such case, the cancelling signal must be in phase with a corresponding interfering station signal. For this purpose, for example, the voltage-controlled amplifier circuit 23 may be formed as a non-inverting amplifier. Also, the phase-locked loop 15 may be replaced by any other known synchronous oscillator. Moreover, the generation of the cancelling signal may be controlled in any other manner, instead of being controlled by switching the supply of operating power voltage over to the circuits 15 and 23 in response to the output voltage of the AND logic circuit 18.

Figure 4:
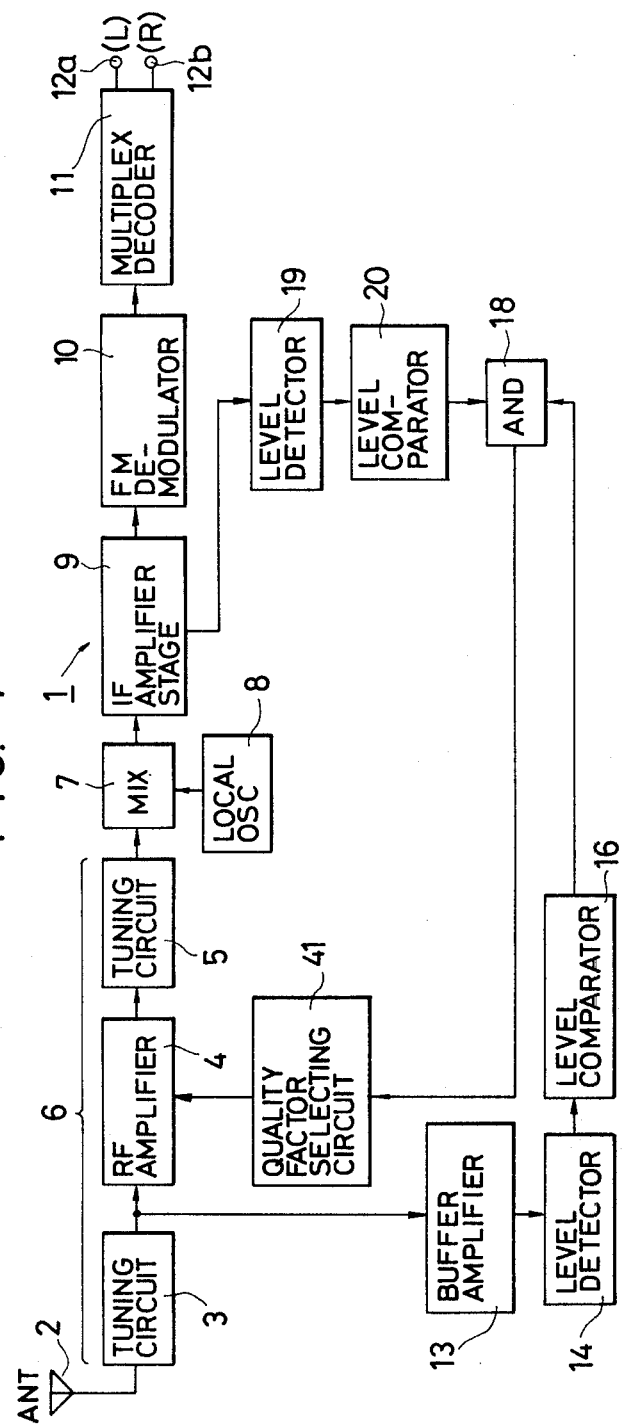
FIG. 4 is a block diagram showing another embodiment of a superheterodyne FM stereophonic radio receiver according to the present invention.

Another embodiment of an FM sterophonic radio receiver according to the present invention is shown in a block form in FIG. 4. In this embodiment, arrangement is provided so that the selectivity of the RF amplifier stage 6 is varied in response to the output level of the AND logic circuit 18. For this selectivity control, there is provided a quality-factor selecting circuit 41. This circuit 41 is arranged to operate in response to the output level of the AND logic circuit 18 so that the input impedance of the RF amplifier 4 is varied by the circuit 41, causing the quality factor of the tuning circuit 3 to vary.

Figure 5:
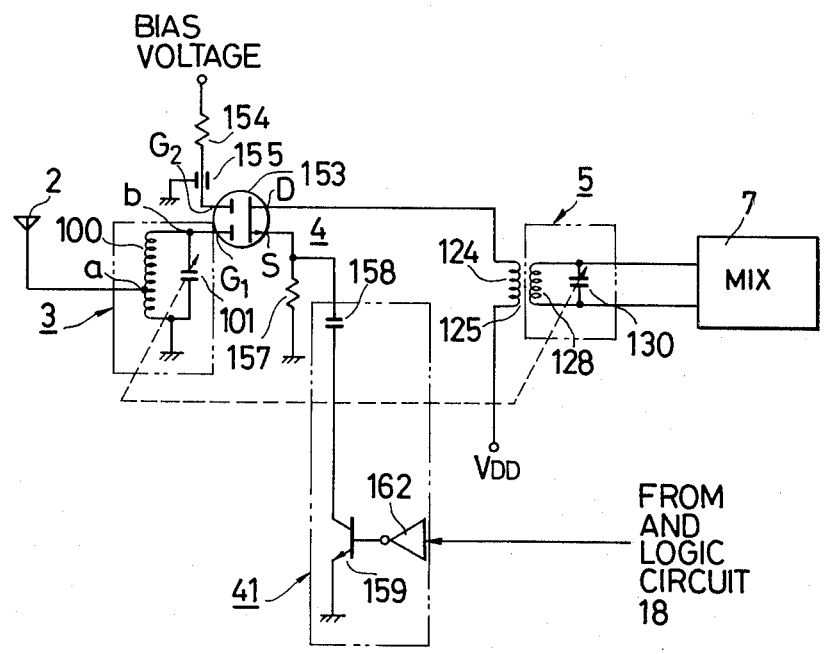
FIG. 5 is a circuit diagram of a high-frequency amplifying stage of the embodiment shown in FIG. 4.

A concrete circuit arrangement for the RF amplifier stage 6 and the quality-factor selecting circuit 41 is shown in FIG. 5. In the Figure, the RF amplifier 4 is comprised of a dual-gate MOS field effect transistor 153. The output of the first tuning circuit 3, which is formed with a parallel circuit of an antenna input coil 100 and a variable capacitor 101, is coupled to the first gate electrode $G_1$ of the transistor 153. The second gate electrode $G_2$ of this transistor is connected to a biasing source (not shown) through a feed-through type capacitor 155 and a resistor 154. The source electrode S of the transistor 153 is grounded via a resistor 157 which provides a source-biasing voltage. The drain electrode D of the transistor is coupled to the primary winding 124 of a transformer 125 which has a secondary winding 128 provided in parallel with a variable capacitor 130 to form the second tuning circuit 5 in the RF amplifier stage 6. The variable capacitor 130 is ganged to the variable capacitor 101 in the first tuning circuit 3. An operating power voltage for the transistor 153 is supplied, through the primary winding 124 of the transformer 125, from a voltage source $V_{DD}$. The capacitor 155 has such capacitance as will offer a sufficiently low impedance for RF frequencies. The quality-factor selecting circuit 41 comprises a bipolar transistor 159 and an inverter gate 162. The transistor 159 is connected across the resistor 157 via a capacitor 158 which has such a capacitance as to provide a negligible impedance for radio frequencies. The inverter gate 162 drives the transistor 159 in response to the output of the AND logic circuit 18 (not shown).

The operation of this system will hereunder be described.

Figure 6:
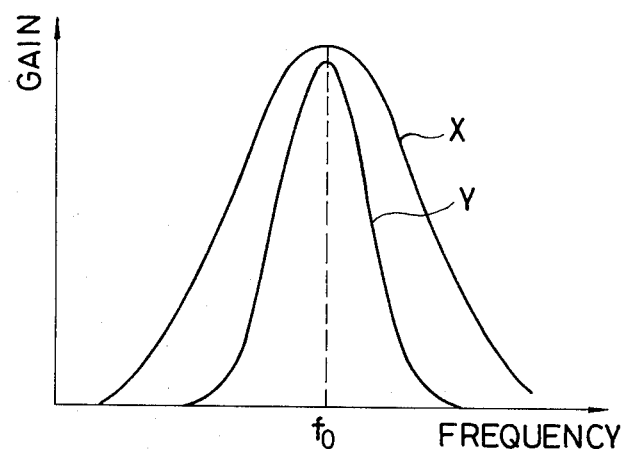
FIG. 6 is a chart showing diagrammatically the frequency-response characteristic curves of the high-frequency amplifying stage, i.e. RF amplifying stage, in the embodiment shown in FIGS. 4 and 5.

In the normal receiving condition in which a desired station signal is selected and received without an interference by an adjacent-channel signal, the output of the AND logic circuit 18 (see FIG. 4) assumes the logical "0", so that the inverter gate 162 supplies a positive voltage which acts to turn the transistor 159 "on". At such time, the source electrode S of the transistor 153 is grounded via a very low impedance (the capacitor 158 and the conducting transistor 159 being connected in series) for radio frequencies. Thus, the input impedance measured at the first gate electrode $G_1$ of the transistor 153 is such that there can be attained a best impedance matching with respect to the first tuning circuit 3 and a moderate quality factor of this tuning circuit. In this condition, the RF amplifier stage 6 represents such frequency response as shown by curve X in FIG. 6. Such frequency-response characteristic best ensures a high-fidelity reception of broadcasting station signals by the receiver.

On the other hand, in case the occurrence of an interference by an adjacent-channel signal is detected and in case, accordingly, a logical "1" level output is provided by the AND logic circuit 18, the transistor 159 is turned off because of the ground potential applied to its base electrode. Therefore, the RF-signal bypath including the capacitor 158 and the transistor 159 is opened, and a relatively large impedance element, i.e. the resistor 157, is left in the source circuit of the transistor 153. Such impedance provides a negative feedback action to the transistor 153, so that the input impedance measured at the first gate electrode $G_1$ of the transistor 153 is increased, with the result that the quality factor of the first tuning circuit 3 is raised. Thus, the frequency-response of the RF amplifier stage 6 becomes sharper as shown by curve Y in FIG. 6. That is, the selectivity of the receiver is increased. Also, the dynamic range of the receiver is widened, though the sensitivity slightly drops because of a slight reduction in the gain of the RF amplifier stage 6. As such, the receiver achieves an improved capability of rejecting the interference by a strong adjacent-channel signal.

It should be understood, of course, that the present invention may be equally effectively applied to AM radio receivers of the superheterodyne system. It will be understood also by those skilled in the art that changes and modifications of the above-described embodiments may be made without departing from the spirit and scope of the present invention as set forth in the claims appended hereto.

What is claimed is:

1. In a superheterodyne radio receiver including an RF amplifier stage and an IF amplifier stage, the improvement comprising:
    interference-detecting means associated with said RF amplifier stage and said IF amplifier stage for detecting the occurrence of an interference caused by reception of an interfering channel signal of an adjacent station at a frequency close to that of a desired station signal to be received by said radio receiver,
    wherein said interference-detecting means comprises:
    first circuit means for detecting the fact that an RF signal level at said RF amplifier stage is higher than a first reference level and for delivering a first signal upon such detection;
    second circuit means for detecting the fact that the IF signal level at said IF amplifier stage is lower than a second reference level and for delivering a second signal upon such detection; and
    third circuit means responsive to said first and second circuit means for generating a detection signal when receiving both of said first and second signals supplied from said first and second circuit means,
    said detection signal being an indication of the occurrence of said interference by the adjacent channel signal in said receiver.

2. A superheterodyne radio receiver according to claim 1, in which:
    said first circuit means comprises:
    a first level detector providing an output signal representing said RF signal level, and
    a first level comparator providing a logical "1" level output signal when the output signal of the first level detector is higher than said first reference level; and in which:
    said second circuit means comprises:
    a second level detector providing an output signal representing said IF signal level, and
    a second level comparator providing a logical "1" level output signal when the output signal of the second level detector is lower than said second reference level; and in which:
    said third circuit means comprises:
    an AND logic circuit receiving as its inputs said output signals of said first and second level comparators, and providing said detection signal when both its inputs have the logical "1" level.

3. A superheterodyne radio receiver according to claim 1, further comprising:
    cancelling-signal generating means for receiving an RF signal from said RF amplifier stage and generating a cancelling signal corresponding to a strongest RF signal component among said RF signal received from said amplifier stage,
    said cancelling signal being inputted to said RF amplifier stage whereby said strongest RF signal component is cancelled out; and
    control means responsive to said interference-detecting means for allowing the cancelling-out action in said RF amplifier stage when said detection signal is supplied by said interference-detecting means.

4. A superheterodyne radio receiver according to claim 3, in which:
    said cancelling-signal generating means comprises:
    fourth circuit means for generating a signal synchronous in frequency with said strongest RF signal component, and
    fifth circuit means for imparting an amplitude-envelope characteristic resembling that of said strongest RF signal component onto said signal generated by said fourth circuit means, to thereby obtain said cancelling signal.

5. A superheterodyne radio receiver according to claim 4, in which:
    said fourth circuit means comprises a phase-locked loop including a phase detector for comparing phases between said strongest RF signal component and an output signal of a voltage-controlled oscillator, and in which:
    a resulting phase-difference signal is fed, through a low-pass filter, back to said voltage-controlled oscillator to keep it synchronous with said strongest RF signal component,
    the output signal of said voltage-controlled oscillator being delivered out as an output signal of said fourth circuit means after passing through a phase shifter.

6. A superheterodyne radio receiver according to claim 4, in which:
    said fifth circuit means comprises:
    a third level detector providing an output signal representing said RF signal level in said RF amplifier stage,
    a voltage-controlled amplifier receiving and amplifying an output signal of said fourth circuit means and having a gain variable in accordance with a gain-control voltage applied thereto,
    a fourth level detector providing an output signal representing the level of the output signal of said voltage-controlled amplifier, and
    a third level comparator comparing the output signals of said third and fourth level detectors and providing said gain-control voltage related to a level difference between said signals applied thereto,
    an output of said voltage-controlled amplifier being fed to said RF amplifier stage as said cancelling signal.

7. A superheterodyne radio receiver according to claim 3, in which:
    said control means comprises:
    a switching circuit responsive to said detection signal supplied by said interference-detecting means,
    an operating power voltage for said cancelling-signal generating means selectively supplied through said switching circuit; and in which:
    said cancelling-signal generating means is rendered operative to generate said cancelling signal by the operating power voltage applied thereto through said switching circuit.

8. A superheterodyne radio receiver according to claim 1, further comprising:
    selectivity-control means responsive to said interference-detecting means for setting the selectivity of said RF amplifier stage to become sharper when said detection signal is supplied from said interference-detecting means, as compared to the condition in which said detection signal is not supplied.

9. A superheterodyne radio receiver according to claim 8, in which:
said RF amplifier stage includes a tuning circuit; and in which:
selectivity control by said selectivity-control means is performed by varying the quality factor of said tuning circuit in response to said detection signal.

10. A superheterodyne radio receiver according to claim 9, in which:
said quality factor of said tuning circuit is dependent upon the impedance of a resistive element provided in parallel with said tuning circuit, and in which:
said selectivity-control means comprises circuit means for varying impedance of said resistive element in response to said detection signal.

11. A superheterodyne radio receiver according to claim 9, in which:
said RF amplifier stage further includes a field effect transistor having a gate electrode coupled to said tuning circuit, a source electrode connected to the circuit ground via a resistive element, and a drain electrode from which the output of said RF amplifier stage is delivered out; and in which:
said selectivity-control means is arranged to operate so that said source electrode of said field effect transistor is connected to the circuit ground through a capacitive element in the absence of said detection signal,
said capacitive element offering a sufficiently small impedance for radio frequencies, as compared to that of said resistive element.

* * * * *